(12) United States Patent
Bales (10) Patent No.: US 10,339,259 B2
(45) Date of Patent: Jul. 2, 2019

(54) METHOD FOR ORGANIZING, CONTROLLING, AND REPORTING ON DESIGN MISMATCH INFORMATION IN IC PHYSICAL DESIGN DATA

(71) Applicant: Synopsys, Inc., Mountain View, CA (US)

(72) Inventor: Mark William Bales, Livermore, CA (US)

(73) Assignee: SYNOPSYS, INC., Mountain View, CA (US)

( * ) Notice: Subject to any disclaimer, the term of this patent is extended or adjusted under 35 U.S.C. 154(b) by 0 days.

(21) Appl. No.: 14/868,342

(22) Filed: Sep. 28, 2015

(65) Prior Publication Data

US 2016/0092627 A1    Mar. 31, 2016

Related U.S. Application Data

(60) Provisional application No. 62/056,277, filed on Sep. 26, 2014.

(51) Int. Cl.
| | | |
|---|---|---|
| *G06F 17/50* | (2006.01) | |
| *G06F 7/50* | (2006.01) | |
| G06F 11/36 | (2006.01) | |
| G06F 11/07 | (2006.01) | |
| G06F 11/00 | (2006.01) | |
| G06F 7/00 | (2006.01) | |

(52) U.S. Cl.
CPC ............ *G06F 17/5081* (2013.01); *G06F 7/50* (2013.01); *G06F 7/00* (2013.01); *G06F 11/00* (2013.01); *G06F 11/07* (2013.01); *G06F 11/36* (2013.01); *G06F 17/5068* (2013.01)

(58) Field of Classification Search
CPC ........ G06F 17/5081; G06F 7/00; G06F 11/07; G06F 11/36; G06F 17/50; G06F 17/5068
See application file for complete search history.

(56) References Cited

U.S. PATENT DOCUMENTS

| | | | | |
|---|---|---|---|---|
| 6,553,548 | B1 * | 4/2003 | Hekmatpour | G06F 17/5022 716/106 |
| 6,560,755 | B1 * | 5/2003 | Zhang | G06F 17/5036 716/111 |
| 6,647,536 | B2 * | 11/2003 | Bradley | G06F 17/5081 716/55 |
| 7,020,582 | B1 * | 3/2006 | Dicosola | G01R 31/2894 250/492.22 |
| 7,243,316 | B2 * | 7/2007 | White | G06F 17/5068 257/E21.244 |
| 7,383,521 | B2 * | 6/2008 | Smith | G06F 17/5068 716/114 |

(Continued)

*Primary Examiner* — Helen Rossoshek
(74) *Attorney, Agent, or Firm* — Alston & Bird LLP (57) ABSTRACT

Systems and methods allow an IC design process to continue in the face of errors while those errors are being investigated and fixed in the actual design data. Potential mismatches can be categorized and a user can choose which action (if any) to take when a specific mismatch is discovered. A set of potential mismatches and their action settings can be aggregated into a higher level setting that the end user of the system can choose during different stages of a design project. A record of the mismatches that have been encountered, the design elements that are involved in each mismatch, and what action where taken to repair the mismatch is kept and maintained.

11 Claims, 6 Drawing Sheets

(56) References Cited

U.S. PATENT DOCUMENTS

| | | | | |
|---|---|---|---|---|
| 7,434,195 | B2 * | 10/2008 | Hsu | G03F 1/36 382/144 |
| 7,506,286 | B2 * | 3/2009 | Beardslee | G01R 31/31705 703/14 |
| 7,827,510 | B1 * | 11/2010 | Schubert | G06F 17/5027 716/111 |
| 8,001,516 | B2 * | 8/2011 | Smith | G06F 17/5068 716/100 |
| 8,046,726 | B2 * | 10/2011 | Lakshmanan | G06F 17/5081 716/111 |
| 8,139,843 | B2 * | 3/2012 | Kulkarni | G06F 17/5045 382/144 |
| 8,171,443 | B1 * | 5/2012 | Chan | G06F 17/505 713/100 |
| 8,209,648 | B1 * | 6/2012 | Ku | G06F 17/5031 716/108 |
| 8,230,371 | B2 * | 7/2012 | Borjon | G03F 1/36 716/54 |
| 8,261,221 | B2 * | 9/2012 | Singhal | G06F 17/5031 716/107 |
| 8,296,708 | B1 | 10/2012 | Chen et al. | |
| 8,607,182 | B2 | 12/2013 | Chen et al. | |
| 8,667,444 | B2 | 3/2014 | Henrickson et al. | |
| 8,667,450 | B2 * | 3/2014 | Wang | G06F 17/5081 716/136 |
| 8,984,458 | B2 * | 3/2015 | Giffel | G06F 17/5022 716/112 |
| 9,195,789 | B2 * | 11/2015 | Mitra | G06F 17/5045 |
| 9,501,597 | B2 * | 11/2016 | Jain | G06F 17/5045 |
| 2003/0009727 | A1 * | 1/2003 | Takeyama | G06F 17/5045 716/114 |
| 2003/0229412 | A1 * | 12/2003 | White | G06F 17/5068 700/121 |
| 2009/0297019 | A1 * | 12/2009 | Zafar | G03F 1/84 382/145 |
| 2010/0257496 | A1 * | 10/2010 | Ferguson | G06F 17/5081 716/112 |
| 2014/0013293 | A1 * | 1/2014 | Hsu | G06F 17/5022 716/133 |
| 2014/0019931 | A1 * | 1/2014 | McCullen | G06F 17/5072 716/122 |
| 2014/0075402 | A1 | 3/2014 | Chen et al. | |

* cited by examiner

METHOD FOR ORGANIZING, CONTROLLING, AND REPORTING ON DESIGN MISMATCH INFORMATION IN IC PHYSICAL DESIGN DATA

CROSS REFERENCE TO RELATED APPLICATIONS

This application claims the benefit of priority under 35 U.S.C. 119(e) to U.S. Provisional Application 62/056,277, filed Sep. 26, 2014 entitled "A METHOD FOR ORGANIZING, CONTROLLING, AND REPORTING ON DESIGN MISMATCH INFORMATION IN IC PHYSICAL DESIGN DATA" the content of which is incorporated herein by reference in its entirety.

BACKGROUND OF THE INVENTION

The present disclosure relates to electronic-design-automation (EDA) techniques. More specifically, the present disclosure relates to a technique for organizing, controlling, and reporting on design mismatch information in integrated circuit (IC) physical design data.

RELATED ART

As semiconductor technology is scaled to ever smaller dimensions, there are commensurate increases in the complexity of digital circuit designs. For example, smaller dimensions typically result in digital circuit designs having an increased number of logic gates and time domains. Moreover, this increase in complexity typically results in a significant increase in the time and cost needed to design and implement digital circuits.

In IC design, data is often incomplete, inconsistent or has mismatches that make the design incorrect in a strict fashion. This is especially true in the initial stages of a large IC design project. Library data may be out of date and may not match the incoming netlist data. Cells may appear in one context with pins that don't match another context. Timing constraints on the design may not match the current netlist.

In the past, many ad hoc techniques have been applied to remediate these problems and allow the design process to continue. While a successful design cannot be created with incomplete or inconsistent data, there can be benefits in doing basic design steps, even when the design is in an incomplete or inconsistent state.

Accordingly, what is desired are improved methods and apparatus for solving some of the problems discussed herein. Additionally, what is desired are improved methods and apparatus for reducing some of the drawbacks discussed herein.

BRIEF SUMMARY OF THE INVENTION

The following portion of this disclosure presents a simplified summary of one or more innovations, embodiments, and/or examples found within this disclosure for at least the purpose of providing a basic understanding of the subject matter. This summary does not attempt to provide an extensive overview of any particular embodiment or example. Additionally, this summary is not intended to identify key/critical elements of an embodiment or example or to delineate the scope of the subject matter of this disclosure. Accordingly, one purpose of this summary may be to present some innovations, embodiments, and/or examples found within this disclosure in a simplified form as a prelude to a more detailed description presented later.

In various embodiments, systems and methods are described by which taxonomy of design mismatches is built. Mechanisms are put in place that allow for repair or remediation of a mismatch, and a recording of the action taken. A system is layered on this basic mechanism to allow aggregation of a set of mismatch settings into an overall high-level mismatch setting. These high-level settings of "prototype", "normal" and "tapeout" are made user controllable. This lets the user control the level of design mismatch that is acceptable; the steps that are taken when a mismatch is discovered; the recording of repaired mismatches; and reporting of the overall state of the design.

A further understanding of the nature of and equivalents to the subject matter of this disclosure (as well as any inherent or express advantages and improvements provided) should be realized in addition to the above section by reference to the remaining portions of this disclosure, any accompanying drawings, and the claims.

BRIEF DESCRIPTION OF THE DRAWINGS

In order to reasonably describe and illustrate those innovations, embodiments, and/or examples found within this disclosure, reference may be made to one or more accompanying drawings. The additional details or examples used to describe the one or more accompanying drawings should not be considered as limitations to the scope of any of the claimed inventions, any of the presently described embodiments and/or examples, or the presently understood best mode of any innovations presented within this disclosure.

DETAILED DESCRIPTION OF THE INVENTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a computer system, a method, a graphical user interface and a computer-program product (i.e., software) for use with the computer system are described. A circuit designer may use these systems, devices, and/or techniques to configure and monitor the execution of tasks in a user-configurable electronic-design-automation (EDA) flow associated with a circuit or circuit design. In particular, using an intuitive and interactive graphical user interface in EDA software, the circuit designer can configure and initiate execution of the EDA flow. Then, during execution of EDA tasks in the EDA flow, an execution monitor in the graphical user interface may provide a graphical representation of real-time execution status information for the EDA tasks. Moreover, using the EDA software, the circuit designer can debug the circuit design if any errors or problems occur.

By providing real-time feedback on progress and any problems, these devices and techniques can improve: project visibility, productivity and/or predictability. For example, using these devices and techniques, chip designers can design circuits or chips that are manufacturing ready in a single-pass design cycle. Consequently, these devices and techniques may make it easier for chip designers to design circuits or chips, which can decrease the time and cost of circuit or chip design, thereby increasing customer satisfaction and retention.

Figure 1:
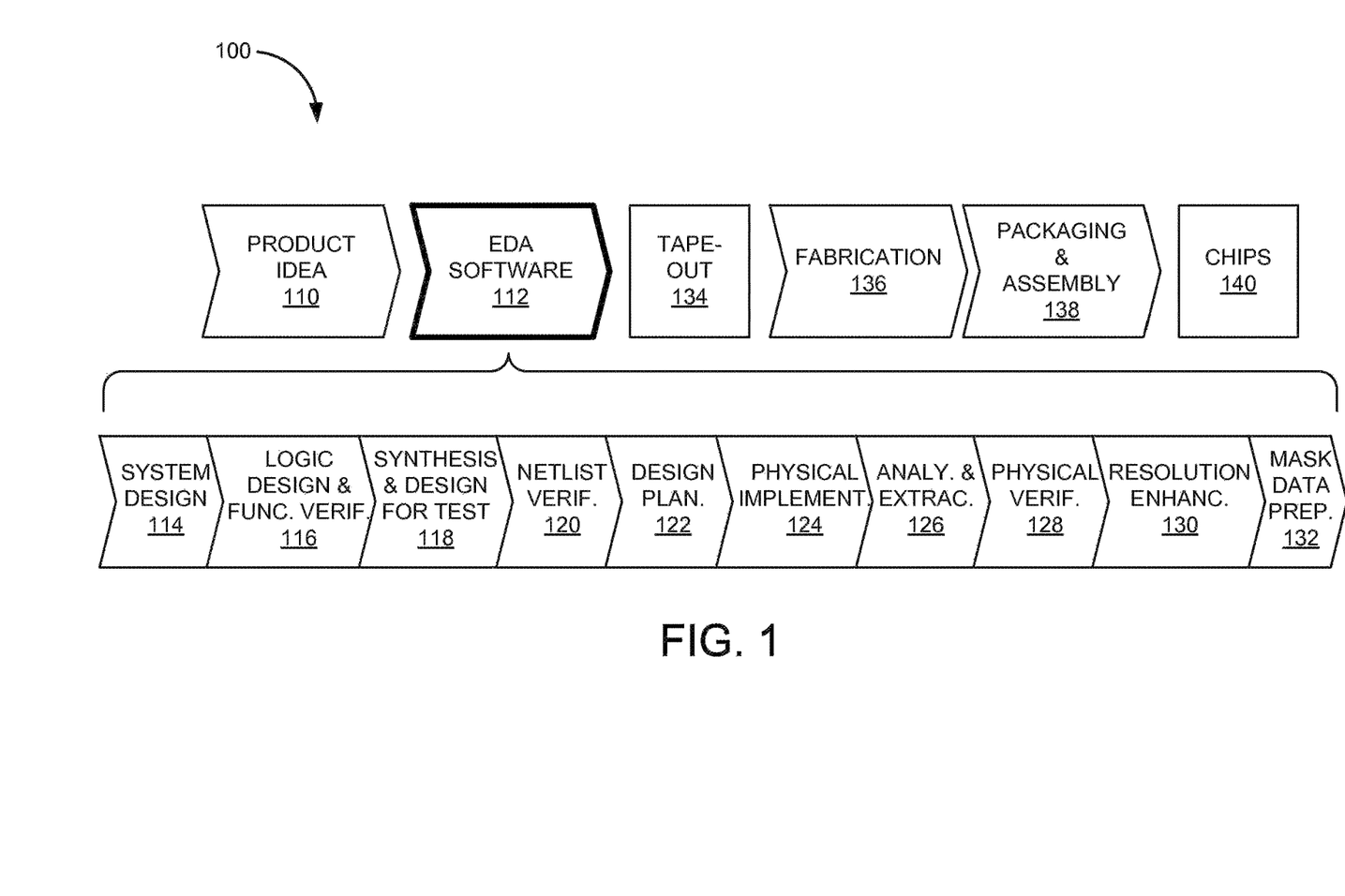
FIG. 1 is a flowchart illustrating various operations in the design and fabrication of an integrated circuit in accordance with an embodiment of the present disclosure.

Embodiments of design and fabrication of integrated circuits or chips are now described with reference to FIG. 1. FIG. 1 is flowchart 100 illustrating the various operations in the design and fabrication of an integrated circuit. This process starts with the generation of a product idea (110), which is realized during a design process that uses electronic design automation (EDA) software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below. This design flow description is for illustration purposes only. In particular, this description is not meant to limit the present disclosure. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect®, Saber, System Studio®, and Designware® products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS®, Vera®, Designware®, Magellan®, Formality®, ESP® and Leda® products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler®, Physical Compiler®, Test Compiler®, Power Compiler®, FPGA Compiler®, Tetramax®, IC Compiler II®, and Designware® products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality®, Primetime®, and VCS® products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro® IC Compiler®, and IC Compiler II Design Planner® products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro® and IC Compiler® products.

Then, during analysis and extraction (126), the circuit function is verified at a transistor level, which permits refinement. Exemplary EDA software products from Synopsys, Inc. of Mountain View, Calif. that can be used at this stage include: Astrorail®, Primerail®, Primetime®, and Star RC/XT® products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules® and IC Validator® products.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus®, Proteus®AF, and PSMGED® products.

Additionally, during mask-data preparation (132), the 'tape-out' data for production of masks to produce finished chips is provided. Exemplary EDA software products from Synopsys, Inc. of Mountain View, Calif. that can be used at this stage include the CATS® family of products.

Embodiments of the present disclosure can be used during one or more of the above-described stages. Specifically, in some embodiments the present disclosure can be used in EDA software that includes operations between design (114) and resolution enhancement (130).

We now describe embodiments of a technique for design portion of the EDA flow. EDA software may provide interactive flow-control environment that includes EDA tools, utilities and automation which allow a user (such as a chip designer) to design a circuit or a chip, including: layout, node optimization, and EDA flows that include multiple EDA tasks or tool scripts. These EDA flows may include block-level flows and full-chip hierarchical flows, which act on a circuit or chip design (which is henceforth referred to as a circuit design).

To accelerate circuit development using the EDA software, the user may use a variety of preconfigured or pre-defined content, including EDA tool scripts with default technology settings and/or default flows associated with blocks in the circuit design. However, the EDA software also supports user-defined technology settings and block configurations (i.e., the EDA software is programmable).

In general, a particular design may be specified by a corresponding user-configurable EDA flow, which includes a sequence of blocks having associated block flows and sub-block or step flows. A given block in the sequence of blocks may include one or more sub-block flows, and a given sub-block in the sub-block flow may represent a sequence of EDA tasks that are performed on a circuit design.

In the description that follows, an EDA task is defined as an EDA tool script that performs a single or small number of related commands on a circuit design. For example, the EDA tasks may include: an elaborate script, a synthesis script, a clock route script, a design-implementation script, a design-optimization script, a design-analysis script, etc. In contrast with operating-system processes, these commands operate on a circuit design. Note that each EDA task may involve multiple operating-system processes.

Moreover, a step flow (or a sub-block flow) is defined as a collection or sequence of inter-coupled EDA tasks that operate on the circuit design. In general, step flows are grouped into functional areas such as: synthesis, floor planning, place and route, chip finishing, etc. Note that a step flow is always 'flat.'

Additionally, a block flow is defined as a collection or sequence of inter-coupled step flows that complete at least a portion of the circuit design. Note that block flows can be hierarchical flows (e.g., flows that have a treed structure with a root level and one or more dependent branches). Furthermore, many circuit designs are specified as a sequence of inter-coupled blocks (and their associated flows).

The EDA software can include foundry-ready technology, designs and libraries, such as EDA tool scripts and flow templates that are preconfigured based at least in part on the requirements associated with particular semiconductor manufacturers or manufacturing facilities, and which are already validated. In addition, the EDA software may provide preconfigured foundry-specific checklists and documentation to assist the user in prompt and successful tape-out of the circuit design.

In order to improve product visibility (and, thus, user productivity), the EDA software may also support the generation of on-demand management reports, including real-time queries during the execution of a user-configurable EDA flow. These reports may be user configured, and may allow the user to monitor performance metrics, such as: area utilization, clock speed, power consumption, and/or any errors that occur during execution of the user-configurable EDA flow.

While assessing the sub-circuit via computer modeling of its functionality, various problems may be identified. Some of these problems may only come to the fore as aspects of the physical implementation are brought into the modeling context. Resolution of these problems may require the designer to re-work or refine a sub-module of the sub-circuit. Furthermore, such refinement may require multiple iterations of the sub-module in evaluation of the changes before the optimal solution is identified. Accordingly, the time associated with each iteration is of significance.

Ad hoc systems for dealing with incomplete and/or inconsistent design data have been in use for many years. In contrast to these attempts, embodiments of the present invention provide an infrastructure for categorizing potential mismatches. A user is provided a choice as to which action (if any) to take when a specific mismatch is discovered. A set of potential mismatches and their action settings can be aggregated into a higher-level setting. The end user of the system can choose the setting during different stages of a design project. In one aspect, mechanisms for keeping a record is provided of mismatches that have been encountered, the design elements that are involved in each mismatch, and what action was taken to repair the mismatch.

Figure 2:
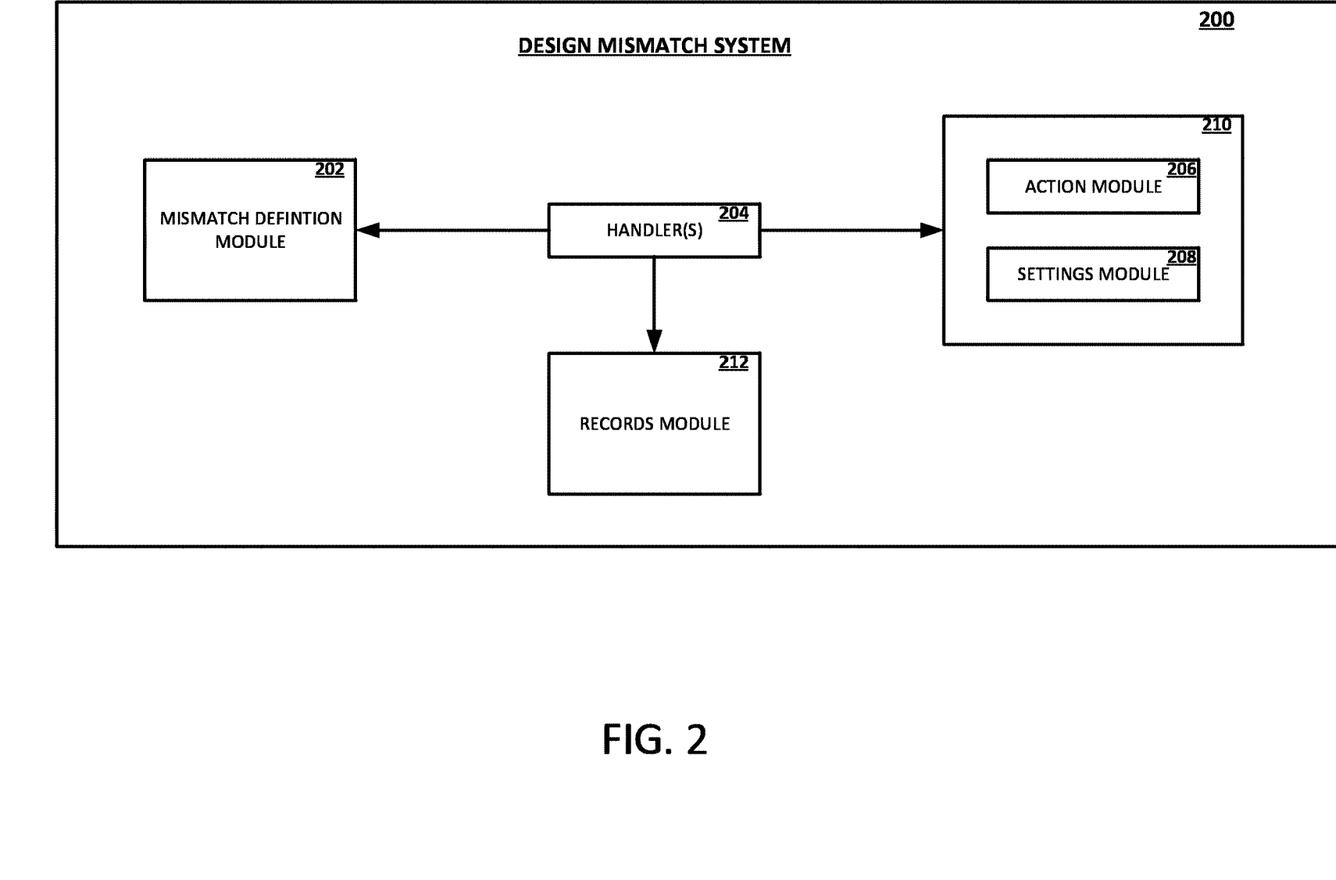
FIG. 2 is an exemplary block diagram of a design mismatch system.

FIG. 2 is an exemplary block diagram of design mismatch system 200. Design mismatch system 200 provides a unified system for application engines to: identify what dirty data they can handle, what mitigation techniques can be used to remedy identified dirty data, tracking and reporting on dirty data and any remedy applied to the dirty data, aggregate collections of application-engine control settings into higher-level settings, and tie into existing app-option, error browser, and checking commands. The term "dirty data" comprises misleading data, incorrect data, inaccurate data, mismatched data, and the like.

With continued reference to FIG. 2, the components of design mismatch system 200 comprises of: mismatch definition module 202, handler(s) 204, repair module 210, and records module 212. Mismatch definition module 202 is an updateable database that stores definitions of potential mismatches that can occur at any stage (e.g. items 114-132 in FIG. 1). The repair module 210 is an updateable database that comprises action module 206 and settings module 208. Action module 206 is an updateable database that stores a set of defined actions to be taken when a certain defined mismatch is detected. The action can be ignoring the mismatch, considering the mismatch an error and halting execution, or repairing the mismatch in accordance with one or more of the system- or user-defined repair methods. Settings module 208 is an updateable database that stores a set of defined settings that are system and/or user-defined, which are high-level settings that are used at various stages of the lifetime of an IC design. Each setting is an aggregation of a list of the potential mismatches along with an action chosen to be taken when the mismatch is encountered. Handler(s) 204, comprise of a detection module and an encounter module. The detection module, with reference to the mismatch definition module 202, detects mismatches. The encounter module, with reference to the repair module 210, takes a certain action when a mismatch is encountered.

Figure 3:
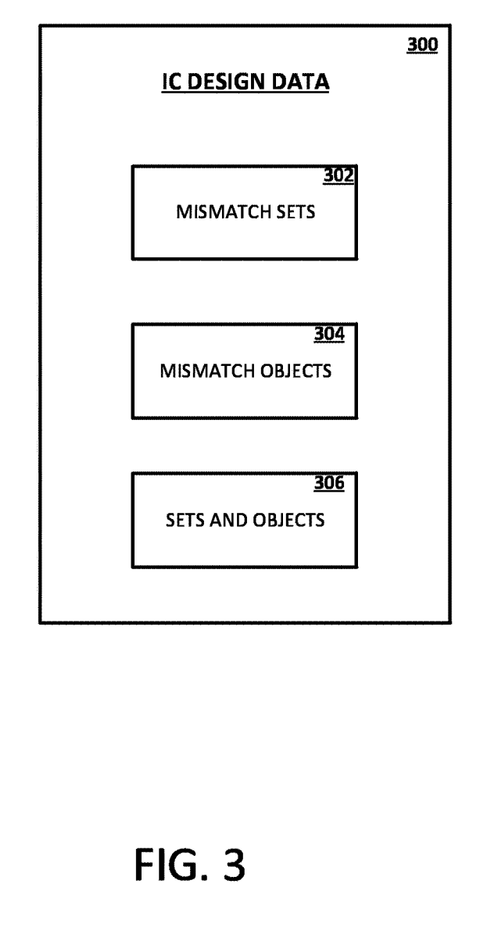
FIG. 3 is an exemplary block diagram of integrated circuit design data that is utilized by a design mismatch system.

FIG. 3 illustrates an exemplary block diagram of IC design data 300 that is used with design mismatch system 200. IC design data 300 comprises of: Sets and objects 306, mismatch sets 302 and mismatch objects 304. IC design data 300 is design data such as library data, Verilog code, and the like. Mismatch sets 302 and mismatch objects 304 represent dirty data that may be included in IC design data 300, whereas sets and objects 306 represent the non-dirty data that may be included in IC design data 300. Dirty data is detected utilizing handlers 204. After the handlers 204 have detected dirty data, records are generated by the handlers for encountered mismatches. Handlers 204 send the records to the records module 212, and the records are stored with links to each corresponding design element and a header element indicating a specific mismatch type. The record database makes it easy and efficient to retrieve all mismatches of a given type and all mismatches involving a specific design element.

The following are examples of potential object mismatches that may be detected by handlers 204 and the potential repair actions performed by handlers 204 to mitigate the mismatch.

For example, when compiling the netlist for the design from original source data such as Verilog or DEF, there may be an extra pin on the instantiation for a leaf cell that does not exist in the leaf cell itself. A possible repair for this mismatch would be to add the missing pin to the definition for the leaf cell. Another possible repair would be to keep a record on the instantiation of the connection, but not modify the leaf cell itself.

In another example, a potential mismatch or inconsistency might be in the value of the capacitance associated with a pin on a leaf cell. This capacitance might be missing, in which case a repair is to synthesize a capacitance in a range likely for the leaf cell given its size and pin count. The capacitance might be too large, and a repair for this case would be to reduce the value into a more reasonable range so there are no deleterious effects on the IC design tools because of the too-large value.

In another example, a potential mismatch is that a leaf cell might be missing entirely from a library. In this case, the repair might be to create an outline for the missing cell which would include an estimation of its size based on the number of pins that connect to it, and an assignment of the cell pins around the synthesized boundary.

It is important to understand that in all of the cases mentioned above, there is no way an IC design completed using these repair actions would be functional. This is one reason why it is vital to keep an accurate and complete record of any repairs that have been made to the design. This record can be used to create a report detailing the mismatches, but more importantly, its mere existence can be used to prevent the system from finalizing a design that would undoubtedly fail.

Separate from the object mismatches described above, there may also be set mismatches in which data found in two or more places is inconsistent. Unlike the above cases, in these cases there is enough information around to be able to determine a repair for the data that will make it correct. The only thing necessary for these types of design mismatch is having the permission to correct the inconsistency. Here are examples of this type of mismatch.

It is possible that a physical form of data might indicate that certain leaf-cell pins are power or ground (or related) pins, while the associated timing data might indicate that these same pins are signal pins. In almost every such case, the power/ground indication is the correct one, and it is possible to make the data correct.

Timing data can include internal pins for leaf cells, that are used as timing arc endpoints but have no physical meaning. These pins are never represented in physical data, and it is easy and proper when creating a unified timing/physical view for a leaf cell to take these internal pins and add them to the unified model.

This class of data inconsistency would not prevent the IC that is created from working properly. Therefore it may be left to the user to decide if the repair/remediation of this class of error should prevent finalizing of the IC. Some users would prefer that their final data be completely clean, while other users are happy to have this kind of inconsistency fixed.

In certain embodiments, design mismatch system 200 allows an IC design process to continue in the face of errors while those errors are being investigated and fixed in the actual design data. By the very end of the design process, there should be no remaining errors of the type that require pure synthesis of data to repair, and any mismatch of this kind that is encountered should be considered an error.

In one aspect, design mismatch system 200 allows a set of potential design mismatches to be defined. Actions can be defined that are taken when the design mismatches are encountered, such as ignoring the mismatch (dangerous but possibly useful early on in the EDA process), repairing the mismatch (using one or more defined repair strategies), or reporting an error (generally halting further progress in the flow). Settings are pre-determined. Examples of pre-determined settings are Tapeout, Normal, and Prototype. Tapeout is the strictest and causes an error and halts for every mismatch. Normal is an intermediate level and will repair some common and easily patched mismatches. Prototype is the most permissive and will repair every possible mismatch to allow the flow to continue.

In certain embodiments, design mismatch system 200 allows users customize the pre-determined settings to set the actions performed. For example, the default Tapeout setting causes an error and halts for every mismatch. However, the user may modify Tapeout such that there is an error and halt for every mismatch except when the mismatch involves the value of capacitance associated with a pin on a leaf cell. Furthermore, the user may create a totally customized setting not based on any pre-defined setting. Design mismatch system 200 also makes a record of mismatched data that is persistent in associated designs. Design mismatch system 200 can also report the mismatch state of the data at any point in the flow.

In further embodiments, design mismatch system 200 allows a user to manually repair mismatched data and mark it as clean. Automatic repairs made to allow for switching settings (for example, going from Prototype to Tapeout mode) can be undone to restore the data to the state expected for the given setting. Design mismatch system 200 can also provide persistent storage the settings as well as the annotations on the design data.

In various embodiments, design mismatch system 200 is used to create user-level commands that are used to create, manipulate and report on the global mismatch settings. Some examples of commands are:

create_mismatch_setting Create a new setting.

current_mismatch_setting Set (or return) the current mismatch setting.

get_mismatch_settings Returns all settings currently defined.

remove_mismatch_setting Delete one of the (user-defined) settings.

report_mismatch_settings Reports on settings, actions and repair strategies.

The following commands are used to retrieve and report on the design-scoped mismatches and the objects that are mismatched:

get_mismatch_set Get the mismatch set for the named or current design.

report_design_mismatch Reports mismatches in the named or current design.

Figure 4:
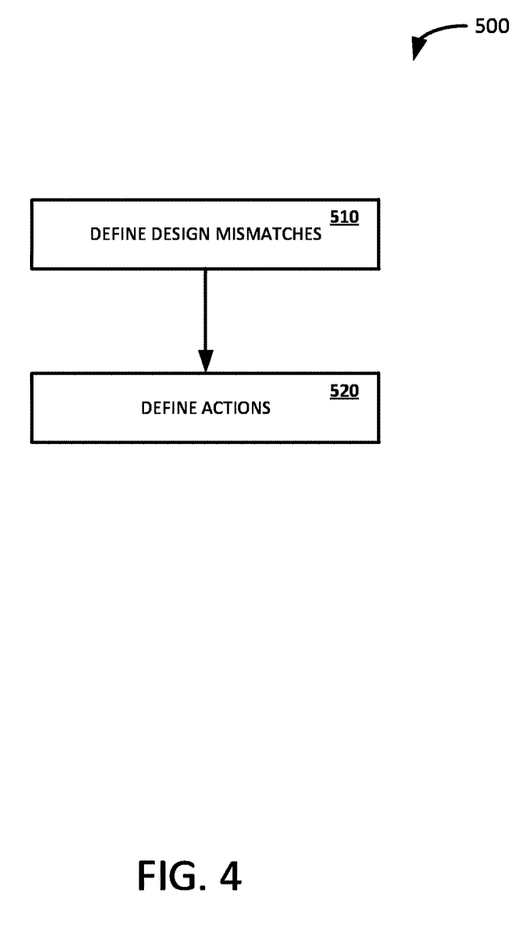
FIG. 4 is an exemplary process of initializing a design mismatch system

FIG. 4 is a flowchart of method 500 for setting up a design mismatch system. Implementations of or processing in method 500 depicted in FIG. 4 may be performed by software (e.g. instructions or code modules) when executed by a central processing unit (CPU or processor) of a logic machine, such as a computer system or information processing device, by hardware components of an electronic device or application-specific integrated circuits, or by combinations of software and hardware elements. Method 500 begins with step 510.

In step 510 a set of design mismatches are defined. These mismatches are defined by a user of an EDA system. However, the set of design mismatches may also be pre-defined by a vendor or by a third party. The set of design mismatches define what type of errors may possibly occur at one or more steps during the EDA process. In some embodiments, the defined design mismatches may be general in nature (i.e. apply to any part of the EDA process), such as detecting whenever the same pin has two different labels (e.g. pin is ground in the physical form of the design data, but the same pin is power in the timing form of the design data). In other embodiments, the defined design mismatches may be operation specific (i.e. apply to specific parts of the EDA process), such as detecting whenever the same pin has two different labels only in the logic design and functional verification process (item 116 of FIG. 1). By allowing the mismatches to be operation specific it allows the user exact control over the error detection process. The set of design mismatches are capable of being continuously updated as more potential mismatches are discovered.

At step 520, a set of actions are defined. Each defined mismatch in step 510, has a corresponding action. There are three different actions that may be taken. The first action is an ignore action, which ignores the detected mismatch. The second action is a repair action, which repairs the detected mismatch by using any suitable repair strategy. The third action is a halting action, which halts further progress until the mismatch is addressed. In other embodiments, there may be any number of other defined actions such as a manual action, which flags the mismatch for manual repair, but does not automatically repair the mismatch.

Also at step 520, a set of settings are defined. Each setting is an aggregated set of actions. There are three different settings. The first setting is a Tapeout setting that performs a halting action for every mismatch detected. The second setting is a Normal setting that performs the repair action on certain mismatches, but not others. The third setting is a Prototype setting that performs the repair action on certain mismatches, but will perform the ignore action for all other mismatches. In another embodiment, settings may be different than the three settings described and/or the settings may be user customized. For example, a user may define a setting called "PinSet" that performs a repair action on pin mismatches, but performs a halting action for every other mismatch. In another embodiment, the EDA process might require specific issues to be addressed. In such a case, a setting may be created called "MustFix" that alerts the user when a defined design mismatch must be fixed before moving on. Then at a later step (e.g. step 650 in FIG. 5) the user can verify that all the corrections have been made.

Figure 5:
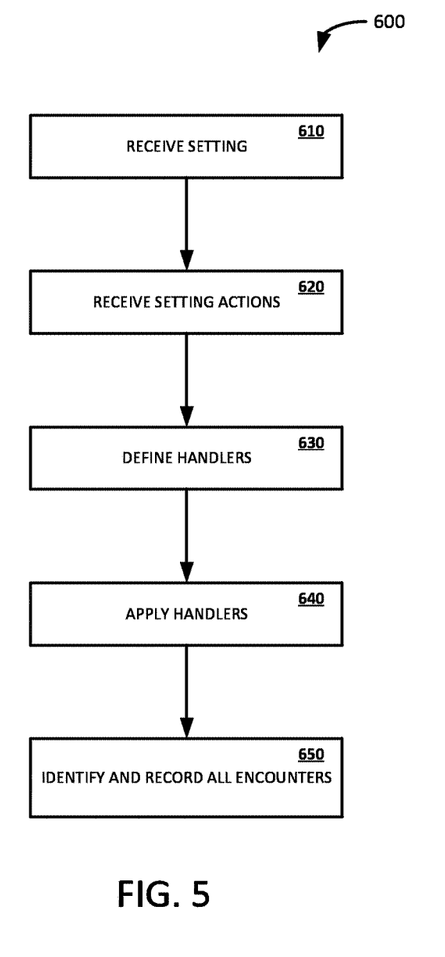
FIG. 5 is an exemplary process of an operation of a design mismatch system.

FIG. 5 is a flow chart of method 600 for the detection and recording of mismatch encounters in accordance with a design mismatch system. Implementations of or processing in method 600 depicted in FIG. 5 may be performed by software (e.g. instructions or code modules) when executed by a central processing unit (CPU or processor) of a logic machine, such as a computer system or information processing device, by hardware components of an electronic device or application-specific integrated circuits, or by combinations of software and hardware elements. Method 600 begins with step 610.

In step 610, a setting is received. For example, the computer system receives a user selected setting such as Prototype, Normal, or Tapeout. In some embodiments, the selected setting may be changed at any point during the EDA process.

In step 620, setting actions are received. The received actions correspond with the selected setting.

In step 630, the handlers are defined. Each handler is comprised of a detection module and an encounter module. The detection module, according the received setting, imports from the mismatch definition module the definition of a mismatch that is to be detected in the EDA process. The encounter module imports, according to the received setting actions, from the repair module a particular action that is to be performed when that mismatch is encounter in the EDA process. For example a handler for handling a pin mismatch first imports from the mismatch definition module the definition of for a pin mismatch (i.e. information that defines what a pin mismatch is, so that a pin mismatch may be detected). The handler then imports from the repair module what action to take when the pin mismatch is encountered (e.g. ignore). Following this process, a handler is created for each defined mismatch.

In step 640, the handlers are applied to IC design data. The handlers will detect mismatches and apply actions to the detected mismatches. In step 650, the handlers produce records that comprises: the mismatches that have been encountered, the design elements that are involved in each mismatch, and what action was taken when the mismatch was encountered. For example, a handler is set to detect a mismatch for pins of a leaf cell (e.g. an AND gate) and perform an ignore action when the mismatch is detected. The handler finds a mismatch between timing data and physical form data that identifies the same leaf-cell pin as power and ground, respectively. Once the handler identifies the mismatch and performs the ignore action a record is produced by the handler that comprises: that identifies a pin mismatch for a leaf cell has been encountered for the inconsistent labeling of a particular pin, indication of the involved leaf-cell, the physical form data, and timing data which caused the mismatch, and an indication of the ignore action performed by the handler. The record is saved in the records module of the design mismatch system.

The records produced by the handler are produced in real-time every time a handler is applied. The records are capable of being produced at any point in the EDA flow, so that a user may determine what and where particular changes have been made.

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

Figure 6:
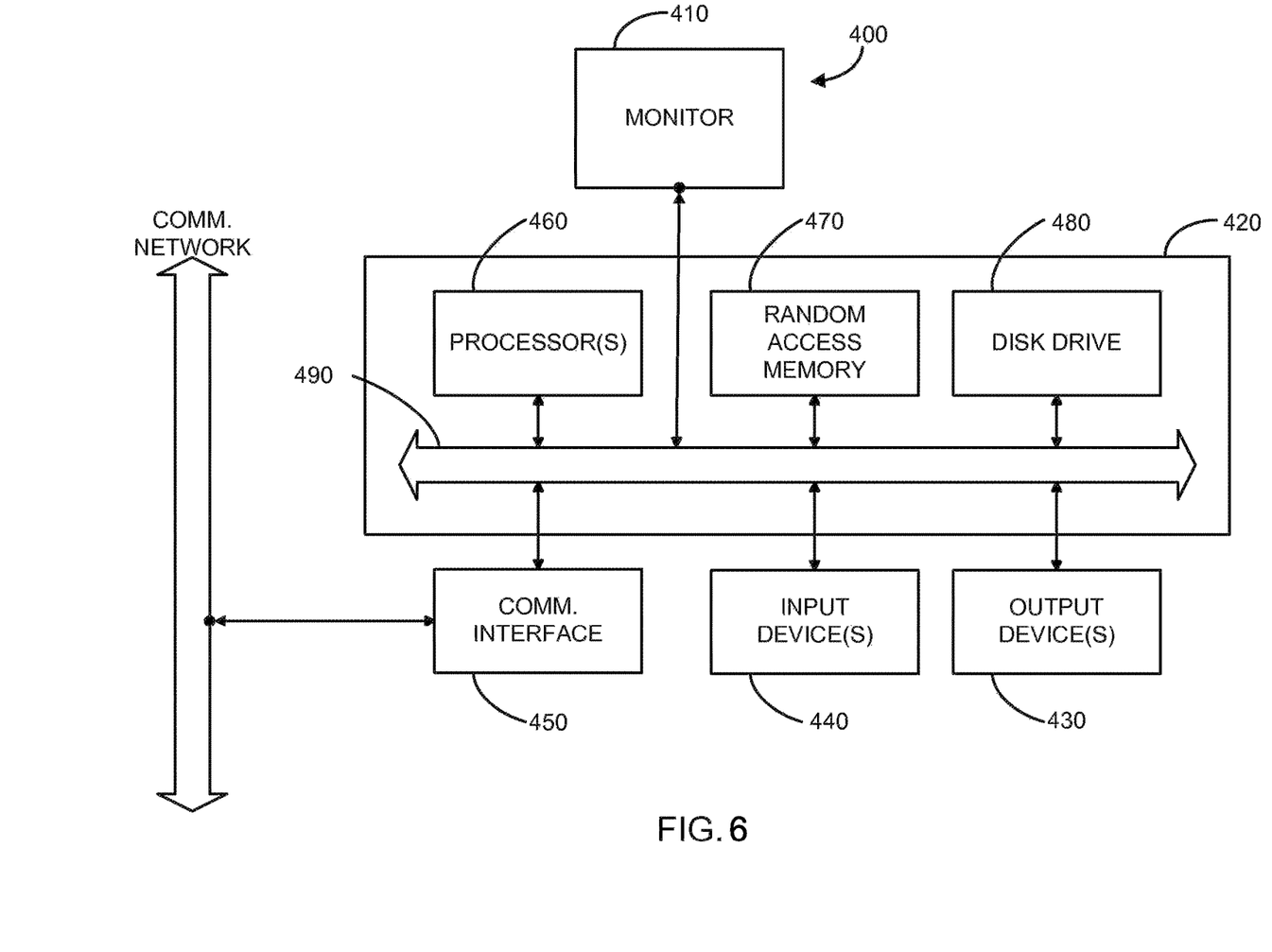
FIG. 6 is a simplified block diagram of a computer system that may incorporate embodiments of the present invention.

FIG. 6 is a simplified block diagram of a computer system 400 that may incorporate embodiments of the present invention. FIG. 6 is merely illustrative of an embodiment incorporating the present invention and does not limit the scope of the invention as recited in the claims. One of ordinary skill in the art would recognize other variations, modifications, and alternatives.

In one embodiment, computer system 400 typically includes a monitor 410, a computer 420, user output devices 430, user input devices 440, communications interface 450, and the like.

As shown in FIG. 6, computer 420 may include a processor(s) 460 that communicates with a number of peripheral devices via a bus subsystem 490. These peripheral devices may include user output devices 430, user input devices 440, communications interface 450, and a storage subsystem, such as random access memory (RAM) 470 and disk drive 480.

User input devices 430 include all possible types of devices and mechanisms for inputting information to computer system 420. These may include a keyboard, a keypad, a touch screen incorporated into the display, audio input devices such as voice recognition systems, microphones, and other types of input devices. In various embodiments, user input devices 430 are typically embodied as a computer mouse, a trackball, a track pad, a joystick, wireless remote, drawing tablet, voice command system, eye tracking system, and the like. User input devices 430 typically allow a user to select objects, icons, text and the like that appear on the monitor 410 via a command such as a click of a button or the like.

User output devices 440 include all possible types of devices and mechanisms for outputting information from computer 420. These may include a display (e.g., monitor 410), non-visual displays such as audio output devices, etc.

Communications interface 450 provides an interface to other communication networks and devices. Communications interface 450 may serve as an interface for receiving data from and transmitting data to other systems. Embodiments of communications interface 450 typically include an Ethernet card, a modem (telephone, satellite, cable, ISDN), (asynchronous) digital subscriber line (DSL) unit, FireWire interface, USB interface, and the like. For example, communications interface 450 may be coupled to a computer network, to a FireWire bus, or the like. In other embodiments, communications interfaces 450 may be physically integrated on the motherboard of computer 420, and may be a software program, such as soft DSL, or the like.

In various embodiments, computer system 400 may also include software that enables communications over a network such as the HTTP, TCP/IP, RTP/RTSP protocols, and the like. In alternative embodiments of the present invention, other communications software and transfer protocols may also be used, for example IPX, UDP or the like.

In some embodiment, computer 420 includes one or more Xeon microprocessors from Intel as processor(s) 460. Further, one embodiment, computer 420 includes a UNIX-based operating system.

RAM 470 and disk drive 480 are examples of tangible media configured to store data such as embodiments of the present invention, including executable computer code, human readable code, or the like. Other types of tangible media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 470 and disk drive 480 may be configured to store the basic programming and data constructs that provide the functionality of the present invention.

Software code modules and instructions that provide the functionality of the present invention may be stored in RAM 470 and disk drive 480. These software modules may be executed by processor(s) 460. RAM 470 and disk drive 480 may also provide a repository for storing data used in accordance with the present invention.

RAM 470 and disk drive 480 may include a number of memories including a main random access memory (RAM) for storage of instructions and data during program execution and a read only memory (ROM) in which fixed instructions are stored. RAM 470 and disk drive 480 may include a file storage subsystem providing persistent (non-volatile) storage for program and data files. RAM 470 and disk drive 480 may also include removable storage systems, such as removable flash memory.

Bus subsystem 490 provides a mechanism for letting the various components and subsystems of computer 420 communicate with each other as intended. Although bus subsystem 490 is shown schematically as a single bus, alternative embodiments of the bus subsystem may utilize multiple busses.

FIG. 6 is representative of a computer system capable of embodying the present invention. It will be readily apparent to one of ordinary skill in the art that many other hardware and software configurations are suitable for use with the present invention. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present invention can be implemented in the form of logic in software or hardware or a combination of both. The logic may be stored in a computer readable or machine-readable storage medium as a set of instructions adapted to direct a processor of a computer system to perform a set of steps disclosed in embodiments of the present invention. The logic may form part of a computer program product adapted to direct an information-processing device to perform a set of steps disclosed in embodiments of the present invention. Based on the disclosure and teachings provided herein, a person of ordinary skill in the art will appreciate other ways and/or methods to implement the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims. In addition, the technique and system of the present invention is suitable for use with a wide variety of EDA tools and methodologies for designing, testing, and/or manufacturing integrated circuits or other electronic devices. The scope of the invention should, therefore, be determined not with reference to the above description, but instead should be determined with reference to the pending claims along with their full scope or equivalents.

Various embodiments of any of one or more inventions whose teachings may be presented within this disclosure can be implemented in the form of logic in software, firmware, hardware, or a combination thereof. The logic may be stored in or on a machine-accessible memory, a machine-readable article, a tangible computer-readable medium, a computer-readable storage medium, or other computer/machine-readable media as a set of instructions adapted to direct a central processing unit (CPU or processor) of a logic machine to perform a set of steps that may be disclosed in various embodiments of an invention presented within this disclosure. The logic may form part of a software program or computer program product as code modules become operational with a processor of a computer system or an information-processing device when executed to perform a method or process in various embodiments of an invention presented within this disclosure. Based on this disclosure and the teachings provided herein, a person of ordinary skill in the art will appreciate other ways, variations, modifications, alternatives, and/or methods for implementing in software, firmware, hardware, or combinations thereof any of the disclosed operations or functionalities of various embodiments of one or more of the presented inventions.

The disclosed examples, implementations, and various embodiments of any one of those inventions whose teachings may be presented within this disclosure are merely illustrative to convey with reasonable clarity to those skilled in the art the teachings of this disclosure. As these implementations and embodiments may be described with reference to exemplary illustrations or specific figures, various modifications or adaptations of the methods and/or specific structures described can become apparent to those skilled in the art. All such modifications, adaptations, or variations that rely upon this disclosure and these teachings found herein, and through which the teachings have advanced the art, are to be considered within the scope of the one or more inventions whose teachings may be presented within this disclosure. Hence, the present descriptions and drawings should not be considered in a limiting sense, as it is understood that an invention presented within a disclosure is in no way limited to those embodiments specifically illustrated.

Accordingly, the above description and any accompanying drawings, illustrations, and figures are intended to be illustrative but not restrictive. The scope of any invention presented within this disclosure should, therefore, be determined not with simple reference to the above description and those embodiments shown in the figures, but instead should be determined with reference to the pending claims along with their full scope or equivalents.

What is claimed is:

1. A method for detecting and reporting design mismatch information in integrated circuit (IC) physical design data generated via a computer-aided electronic design automation (EDA) system, comprising:
   receiving, at a computer, a plurality of sets of design mismatch settings each identifying potential mismatch types generated via the EDA system;
   receiving, at the computer, a selection of a set of design mismatch settings selected from the plurality of sets of design mismatch settings;
   configuring, at the computer, one or more handlers for execution with the EDA system based at least in part on the selected set of design mismatch settings, wherein the one or more handlers comprise a detecting module configured to import at least a portion of the selected set of design mismatch settings to detect a mismatch within the IC physical design data satisfying at least one potential mismatch type of the selected set of design mismatch settings and an encounter module configured to automatically perform one or more actions to detected design mismatches within the IC physical design data;
   applying, via the EDA system executing on the computer, the one or more handlers to the physical design data;
   automatically performing, via the encounter module of the one or more handlers operating via the EDA system executing on the computer, one or more actions with respect to one or more detected design mismatches;
   generating, by the computer, a record identifying the performed one or more actions.

2. The method of claim 1 wherein the set of design mismatch settings comprise information defining potential mismatches and one or more actions to perform for each potential mismatch.

3. The method of claim 1, wherein generating, by the computer, the record identifying the performed or more actions comprises:
   identifying the mismatches that have been detected;
   identifying the design elements that are involved in each detected mismatch; and
   identifying the one or more actions performed.

4. The method of claim 2, wherein creating, at the computer, the one or more handlers based on the set of design mismatch settings comprises:
   creating, by the computer, the detecting module to detect a design mismatch;
   creating, by the computer, the encounter module to perform the one or more actions to the detected design mismatch.

5. The method of claim 2, further comprising aggregating, by the computer, the mismatch settings into a set of instructions and creating, at the computer, the one or more handlers based on the set of instructions.

6. A non-transitory computer-readable medium storing a computer-program product which when executed by a processor of the computer causes the processor to implement the method of claim 1.

7. A design mismatch system comprising a non-transitory computer readable storage medium in communication with one or more processors adapted to detect and report design mismatch information in integrated circuit (IC) physical design data generated via a computer-aided electronic design automation (EDA) system, the system configured to:
   receive, via the one or more processors, a plurality of sets of design mismatch settings each identifying potential mismatch types generated via the EDA system;
   receive, via the one or more processors, a selection of a set of design mismatch settings selected from the plurality of sets of design mismatch settings;
   configure, via the one or more processors, one or more handlers for execution with the EDA system based at least in part on the selected set of design mismatch settings, wherein the one or more handlers comprise a detecting module configured to import at least a portion of the selected set of design mismatch settings to detect a mismatch within the IC physical design data satisfying at least one potential mismatch type of the selected set of design mismatch settings and an encounter module configured to automatically perform a defined action to detected design mismatches within the IC physical design data;

apply, via the EDA system executing via the one or more processors, the one or more handlers to the physical design data;

automatically perform, via the encounter module of the one or more handlers operating via the EDA system executing via the one or more processors, one or more actions with respect to one or more detected design mismatches;

generate, via the one or more processors, a record identifying the performed one or more actions.

8. The system of claim 7, wherein the set of design mismatch settings comprise information defining potential mismatches and one or more actions to perform for each potential mismatch.

9. The system of claim 7, wherein generate, by the computer, the record identifying the performed or more actions comprises:
identify the mismatches that have been detected;
identify the design elements that are involved in each detected mismatch; and
identify, the one or more actions performed.

10. The system of claim 8, wherein create, at the computer, the one or more handlers based on the set of design mismatch settings comprises:
create, via the computer, the detecting module to detect a design mismatch;
create, via the computer, the encounter module to perform the one or more actions to the detected design mismatch.

11. The system of claim 8, further configured to aggregate, via the computer, the mismatch settings into a set of instructions and create, via the computer, the one or more handlers based on the set of instructions.

* * * * *